(12) United States Patent
Savoj (10) Patent No.: US 9,124,413 B2
(45) Date of Patent: Sep. 1, 2015

(54) CLOCK AND DATA RECOVERY FOR NFC TRANSCEIVERS

(75) Inventor: Jafar Savoj, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 548 days.

(21) Appl. No.: 13/282,342

(22) Filed: Oct. 26, 2011

(65) Prior Publication Data

US 2013/0107913 A1 May 2, 2013

(51) Int. Cl.
| | |
|---|---|
| H03L 7/08 | (2006.01) |
| H04L 7/033 | (2006.01) |
| H04B 5/00 | (2006.01) |
| H04L 27/02 | (2006.01) |
| H04L 7/10 | (2006.01) |
| H04B 5/02 | (2006.01) |
| H03L 7/089 | (2006.01) |
| H04L 27/06 | (2006.01) |

(52) U.S. Cl.
CPC ............... *H04L 7/0331* (2013.01); *H03L 7/08* (2013.01); *H03L 7/0891* (2013.01); *H04B 5/00* (2013.01); *H04B 5/02* (2013.01); *H04L 7/10* (2013.01); *H04L 27/02* (2013.01); *H04L 27/06* (2013.01)

(58) Field of Classification Search
CPC .......... H04B 5/00; H04B 5/02; H04B 5/0025; H03L 7/0891; H03L 2207/50; H03L 7/08; H03L 7/091; H04L 27/06; H04L 27/02; H04L 27/2272
USPC ......... 375/219, 295, 268, 327, 300, 320, 355, 375/373, 375, 376; 327/150, 156, 159; 332/149
See application file for complete search history.

(56) References Cited

U.S. PATENT DOCUMENTS

| | | | | |
|---|---|---|---|---|
| 3,660,781 | A * | 5/1972 | Tewksbury et al. ........... | 331/1 A |
| 4,947,407 | A | 8/1990 | Silvian | |
| 5,016,257 | A * | 5/1991 | Wolf et al. .................... | 375/130 |
| 5,568,512 | A | 10/1996 | Rotzoll | |
| 5,686,903 | A | 11/1997 | Duckworth et al. | |
| 5,748,044 | A | 5/1998 | Xue | |
| 5,905,761 | A * | 5/1999 | Je et al. ......................... | 375/320 |
| 6,028,727 | A | 2/2000 | Vishakhadatta et al. | |
| 6,044,123 | A | 3/2000 | Takla | |
| 6,057,791 | A * | 5/2000 | Knapp ........................... | 341/122 |
| 7,089,444 | B1 * | 8/2006 | Asaduzzaman et al. ...... | 713/600 |
| 7,512,188 | B1 * | 3/2009 | Watson et al. ................ | 375/279 |
| 8,513,987 | B1 * | 8/2013 | Kim et al. ..................... | 327/115 |
| 2003/0162566 | A1 * | 8/2003 | Shapira et al. ................ | 455/561 |
| 2003/0190006 | A1 * | 10/2003 | Nagano ......................... | 375/376 |
| 2004/0193975 | A1 * | 9/2004 | Tarango et al. ............... | 714/724 |

(Continued)

FOREIGN PATENT DOCUMENTS

| | | |
|---|---|---|
| EP | 1793499 A1 | 6/2007 |
| KR | 20070096713 A | 10/2007 |

OTHER PUBLICATIONS

International Search Report and Written Opinion—PCT/US2012/062268—ISA/EPO—Jun. 12, 2013.

(Continued)

*Primary Examiner* — Jean B Corrielus (57) ABSTRACT

Exemplary embodiments are directed to data and clock recovery in NFC transceivers. A transceiver may include a phase-locked loop configured to recover a clock from a received input signal in a first mode and enable for oversampling of an output signal in a second, different mode.

23 Claims, 8 Drawing Sheets

(56) References Cited

U.S. PATENT DOCUMENTS

| | | | | |
|---|---|---|---|---|
| 2005/0156800 | A1* | 7/2005 | Sankaranarayanan | 343/753 |
| 2006/0031701 | A1* | 2/2006 | Nam et al. | 713/500 |
| 2006/0158259 | A1* | 7/2006 | Ishizaka et al. | 331/10 |
| 2006/0176934 | A1* | 8/2006 | Riedel et al. | 375/130 |
| 2006/0220759 | A1* | 10/2006 | Arisawa | 332/149 |
| 2007/0110206 | A1* | 5/2007 | Leung et al. | 375/376 |
| 2007/0208975 | A1* | 9/2007 | Katti et al. | 714/727 |
| 2008/0144454 | A1* | 6/2008 | Bottemiller et al. | 369/47.14 |
| 2008/0252421 | A1* | 10/2008 | Khannur et al. | 340/10.1 |
| 2009/0012768 | A1* | 1/2009 | Son et al. | 703/13 |
| 2009/0015338 | A1* | 1/2009 | Frey | 331/16 |
| 2009/0046809 | A1* | 2/2009 | Meltzer | 375/308 |
| 2009/0140896 | A1* | 6/2009 | Adduci et al. | 341/131 |
| 2009/0174592 | A1 | 7/2009 | Muellner | |
| 2009/0284318 | A1* | 11/2009 | Machado | 331/16 |
| 2009/0315603 | A1* | 12/2009 | Bancel et al. | 327/202 |
| 2009/0323853 | A1* | 12/2009 | Hsu | 375/294 |
| 2010/0197349 | A1 | 8/2010 | Morita et al. | |
| 2010/0310031 | A1* | 12/2010 | Ballantyne et al. | 375/376 |
| 2011/0102262 | A1* | 5/2011 | Haskell | 342/372 |
| 2011/0121874 | A1* | 5/2011 | Kaneko et al. | 327/157 |
| 2011/0215846 | A1* | 9/2011 | Furuta | 327/148 |
| 2011/0249519 | A1* | 10/2011 | Tamura | 365/189.15 |
| 2011/0254600 | A1* | 10/2011 | Kato et al. | 327/156 |
| 2011/0261915 | A1* | 10/2011 | Li | 375/359 |
| 2012/0033559 | A1* | 2/2012 | Kim | 370/241 |
| 2012/0045214 | A1* | 2/2012 | Lee et al. | 398/98 |
| 2012/0050107 | A1* | 3/2012 | Mortazawi et al. | 342/372 |
| 2013/0314280 | A1* | 11/2013 | Maltsev et al. | 342/368 |
| 2014/0266465 | A1* | 9/2014 | Kermalli | 330/295 |

OTHER PUBLICATIONS

Partial International Search Report and Written Opinion—PCT/US2012/062268 ISA/EPO—Feb. 6, 2013.

* cited by examiner

CLOCK AND DATA RECOVERY FOR NFC TRANSCEIVERS

BACKGROUND

1. Field

The present invention relates generally to near field communication (NFC). More specifically, the present invention relates to clock and data recovery for NFC transceivers.

2. Background

Near Field Communication (NFC) is wireless technology that can enable for short range exchange of information between two or more devices. Devices capable of NFC can simplify presence-oriented transactions to enable for rapid and more secure exchange of information, for example, as in purchases for goods and services, or the exchange of information therein.

As a person skilled in the art will appreciate and understand, NFC technologies communicate over magnetic field induction, where at least two loop antennas are located within each other's "near field," effectively forming an air-core transformer that operates within a globally available and unlicensed radio frequency which, as indicated, is an industrial, scientific and medical (ISM) band of 13.56 MHz, with a band width of almost two (2) MHz.

Conventional NFC transceivers utilize two separate phase lock loops (PLLs) for frequency synthesis and clock and data recovery (CDR). More specifically, conventional devices may utilize a high-frequency PLL to enable for oversampling of a transmitter output in an initiator mode, and a low-power PLL to recover a clock from an input signal in a tag mode. As will be appreciated by a person having ordinary skill in the art, utilization of two separate PLLs consumes a large area and increases the bill of materials (BOM) due to the increased number of external PLL loop filter components. A need exists for methods, systems, and devices for an NFC transceiver configured to utilize a single phased-locked loop, which may operate in both an initiator mode and a tag mode. Further, a need exists for the phase-locked loop to operate and detect signals associated with NFC and RFID standards including a 100% amplitude-shift keying signal.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

NFC is a communication standard that enables wireless communication devices, such as cellular telephones, SmartPhones, and personal digital assistants (PDAs) to establish peer-to-peer (P2P) networks. NFC may enable electronic devices to exchange data and initiate applications automatically when they are brought in close proximity, for example ranges from less than a centimeter to a distance of about 10 cm. As non-limiting examples, NFC may enable downloading of images stored in a digital camera to a personal computer, downloading of audio and video entertainment to portable devices, or downloading of data stored in a SmartPhone to a personal computer or other wireless device. NFC may be compatible with smart card technologies and may also be utilized to enable purchase of goods and services. In an exemplary embodiment, the frequency used for NFC is centered at about 13.56 MHz.

An NFC transceiver may include circuitry to impedance match to an antenna or other circuitry within a coupling element. The NFC transceiver may also include suitable logic, circuitry, processors, code, or combinations thereof to enable the reception and transmission of NFC signals, for which the carrier frequency of the received signal is in the NFC frequency band. Data may be modulated on the carrier frequency.

Conventional NFC may be based on Radio-Frequency Identification (RFID) technology that uses field induction to enable communication between electronic devices in close proximity. This can enable users to perform intuitive, safe, contactless transactions. Conventional state-of-the art NFC may operate at 13.56 MHz and transfers data at up to 424 Kbits/second. Of course, improvements to NFC technology may result in differing frequency(s), differing throughput values, or both. Communication between two or more NFC-compatible devices may occur when the devices are brought within a short distance from one another and maybe compatible with other known wireless technologies such as Bluetooth or Wi-Fi, for example.

Currently, there are two principal modes of operation available under present NFC standards: active and passive (i.e., powered by field). In active mode, a device may generate its own radio field to transmit data. In passive mode, one device may generate a radio field, while the other uses load modulation to transfer data. The passive mode of communication is often useful for limited power devices, such as mobile phones and PDAs, which need to minimize energy use. It may also prevent disruption of NFC communication when the device battery runs out.

In the various exemplary embodiments described herein, the term NFC is understood to encompass any now or future known wireless or near-proximity communication protocols or systems that facilitate the short-range wireless transfer of information, and is understood to not be limited to current standards or protocols promulgated by an NFC standards body or organization. Accordingly, NFC is understood to be applied herein as a generic sense of the term.

As will be understood by a person having ordinary skill in the art, an NFC transceiver may need a high-frequency PLL at an integer multiple of 13.56 MHz to enable for oversampling of a transmitter output in an initiator node. Also, the NFC transceiver may require an ultra low-power PLL to recover a clock from an input signal received in a tag (i.e., powered-by-field) mode of operation. Further, an NFC transceiver may be required to support multiple modes of modulation. For example, in a 100% amplitude-shift keying mode, an NFC transceiver may need to recover a clock signal even though there is no input signal.

Figure 1:
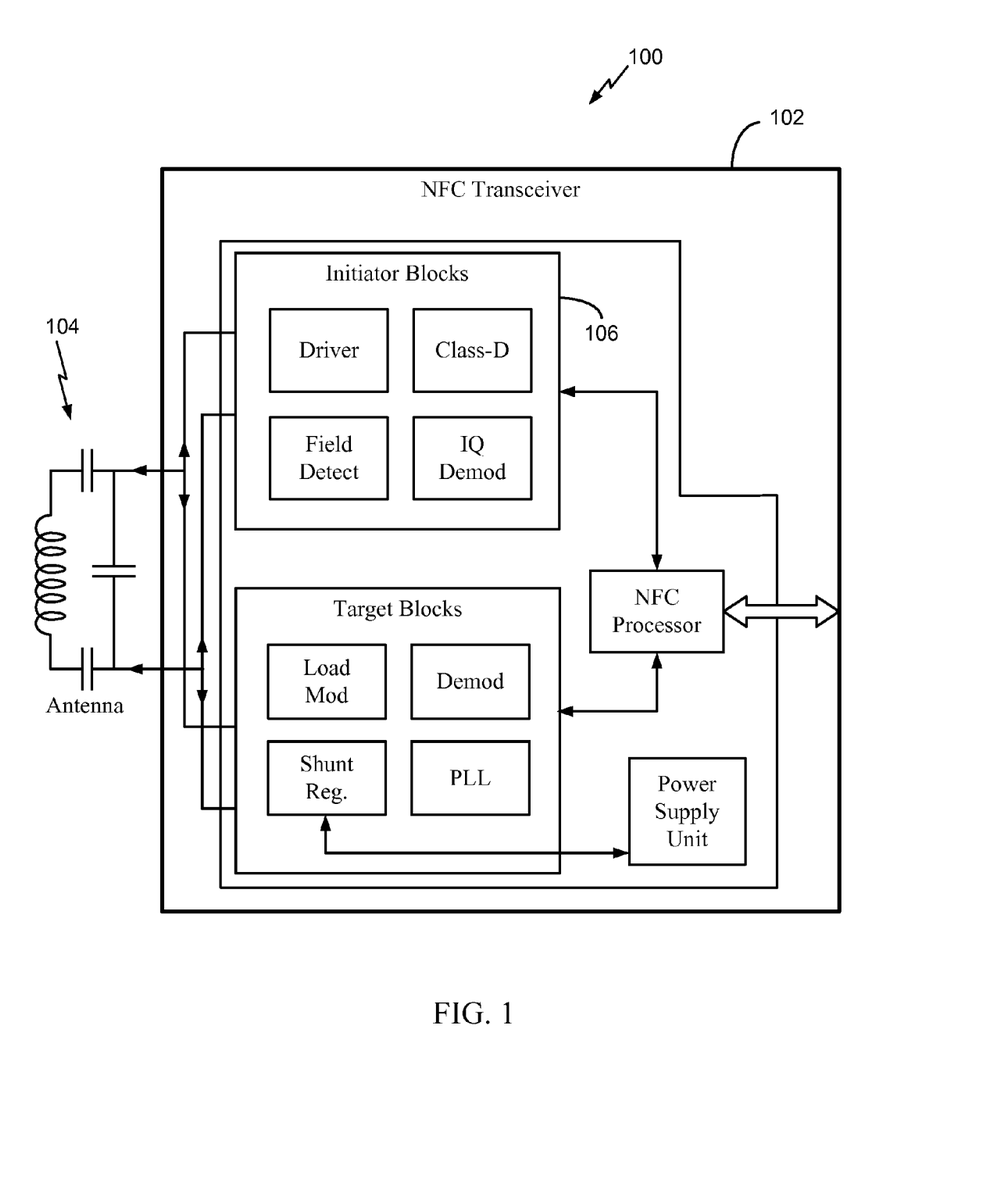
FIG. 1 illustrates a conventional NFC system.

FIG. 1 is an illustration of a conventional NFC system 100 including an NFC transceiver 102 coupled to an antenna 104. A system PLL (i.e., within initiator blocks 106) produces an over-sampling clock (e.g., a 24-times over-sampling clock) running at 325.44 MHz (i.e., 13.56*24=325.44 MHz). Further, another clock recovery PLL (i.e., within target blocks 108), which is used in tag mode through division by 4, 8, 16 or 32, creates a clock useful for a demodulator. As noted above, utilization of two separate PLLs consumes a large area and increases the bill of materials (BOM). It is noted that for certain modulation types, a clock can be recovered by passing an input signal through a comparator. However, this approach is not practical when the input signal utilizes 100% amplitude-shift keying (ASK) modulation.

Figure 2:
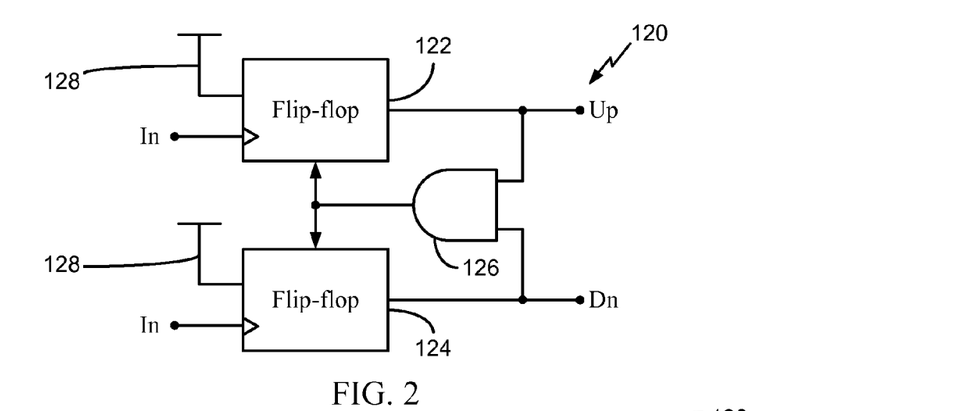
FIG. 2 illustrates a conventional phase-frequency detector used inside a PLL.

FIG. 2 illustrates a phase-frequency detector 120 including a first flip-flop 122, a second flip-flop 124, and an AND gate 126. Flip-flop 122 is configured to receive a reference signal 128 and an input signal In and flip-flop 124 is configured to receive reference signal 128 and input signal In. AND gate 126 is configured to receive a signal (Up) output from flip-flop 122 and a signal (Dn) output from flip-flop 124. Phase-frequency detectors are well known in the art and, therefore, details of phase-frequency detector 120 and operation thereof will not be discussed in detail.

Figure 3A:
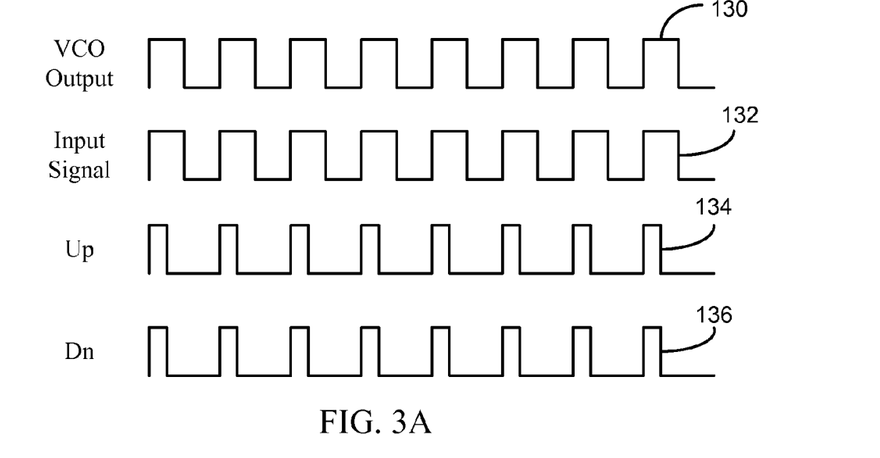
FIGS. 3A and 3B depict waveforms associated with a conventional phase-frequency detector.
Figure 3B:
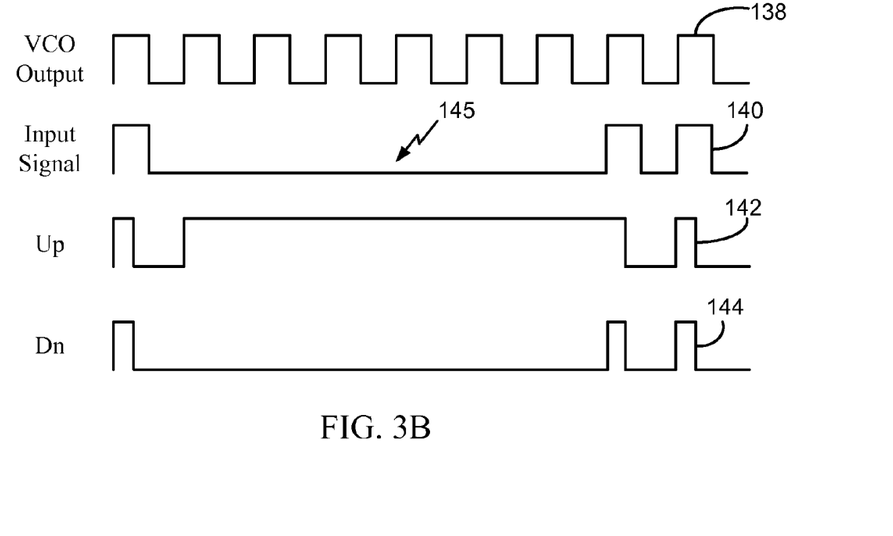

FIGS. 3A and 3B illustrate example waveforms associated with phase-frequency detector 120. With specific reference to FIG. 3A, signal 130 depicts an output of an associated VCO, signal 132 represents an input signal provided to phase-frequency detector 130, signal 134 represent the "Up" output signal and signal 136 represent the "Dn" output signal. FIG. 3A represents waveforms in a non 100% ASK mode. With specific reference to FIG. 3B, signal 138 depicts an output of an associated VCO, signal 140 represents an input signal provided to phase-frequency detector 120, signal 142 represent the "Up" output signal and signal 144 represent the "Dn" output signal. FIG. 3B represents waveforms in a 100% ASK mode. As illustrated by reference numeral 145, input signal 140 remains at zero for an extended period. Furthermore, during this period wherein input signal is at zero, phase-frequency detector 120 and an associated charge pump are still active and, furthermore, signal 138, which represents the VCO output, is still adjusting. Stated another way, as will be appreciated by a person having ordinary skill in the art, if a conventional phase-frequency detector (e.g., phase-frequency detector 120) is used for a 100% ASK signal, an associated charge pump may produce an erroneous correction signal that may cause dithering of the VCO frequency. This effect may be suppressed if a small loop bandwidth and external filter components are utilized. However, this may cause long acquisition times.

Exemplary embodiments of the present invention, as described herein, are related to an NFC transceiver having a single PLL configured to operate in both a tag mode (e.g., with a low-power VCO) and an initiator mode (e.g., with a high-frequency VCO). Further, in the tag mode, the NFC transceiver may be configured to detect a 100% ASK mode of operation and, in response thereto, may adjust accordingly.

Figure 4:
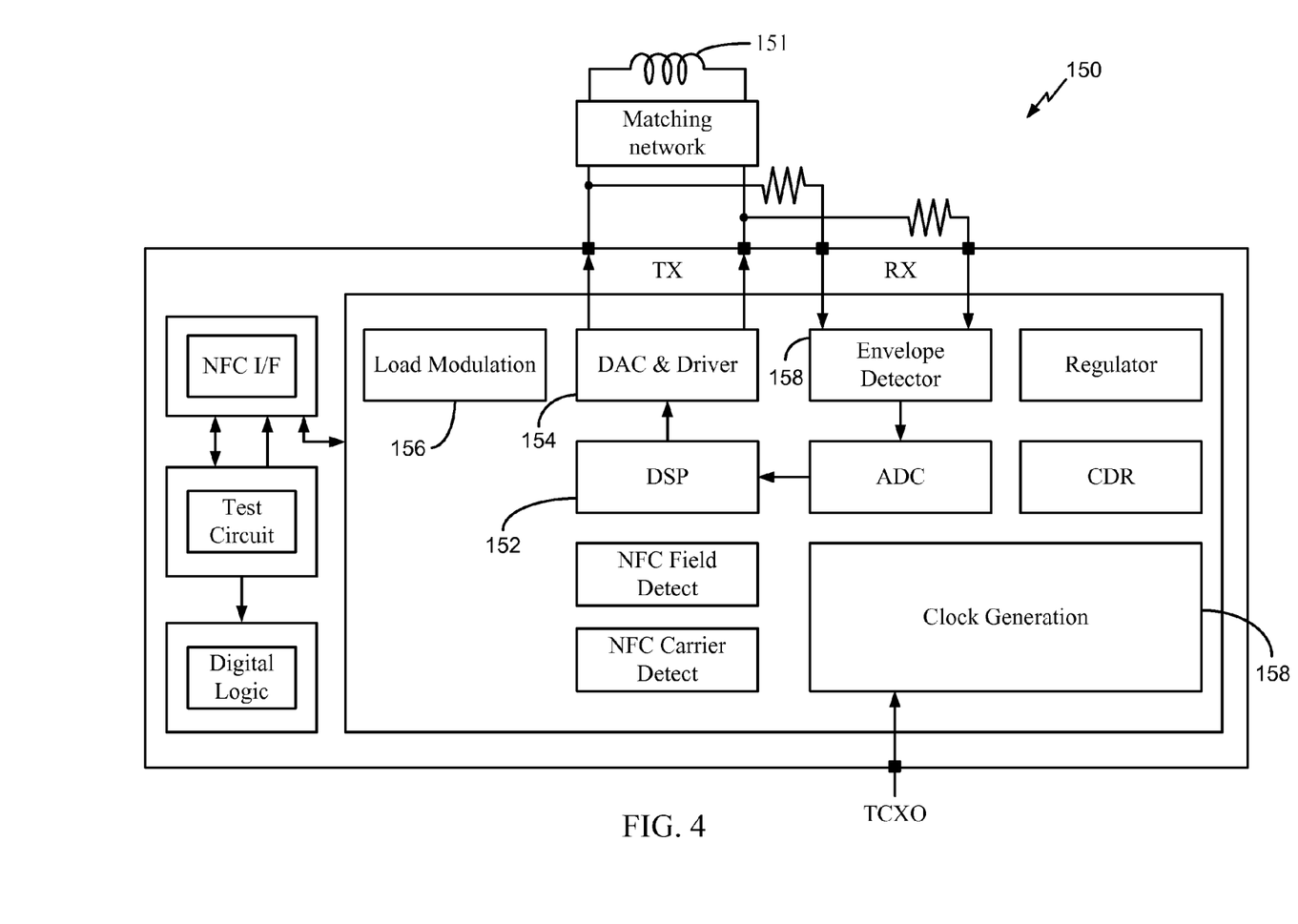
FIG. 4 is a block diagram of an NFC transceiver, in accordance with an exemplary embodiment of the present invention.

FIG. 4 is a block diagram of an NFC transceiver 150, which is configured to support both active and passive modes, as mentioned above. NFC transceiver 150 includes, among other components, an antenna 151, a digital signal processor (DSP) 152, which is also commonly referred to as a baseband modem, a digital-to-analog converter (DAC) & driver module 154, and a load modulation module 156. NFC transceiver 150 further includes a clock generation element 158, which may be configured for clock and data recovery, as described more fully below.

Figure 5:
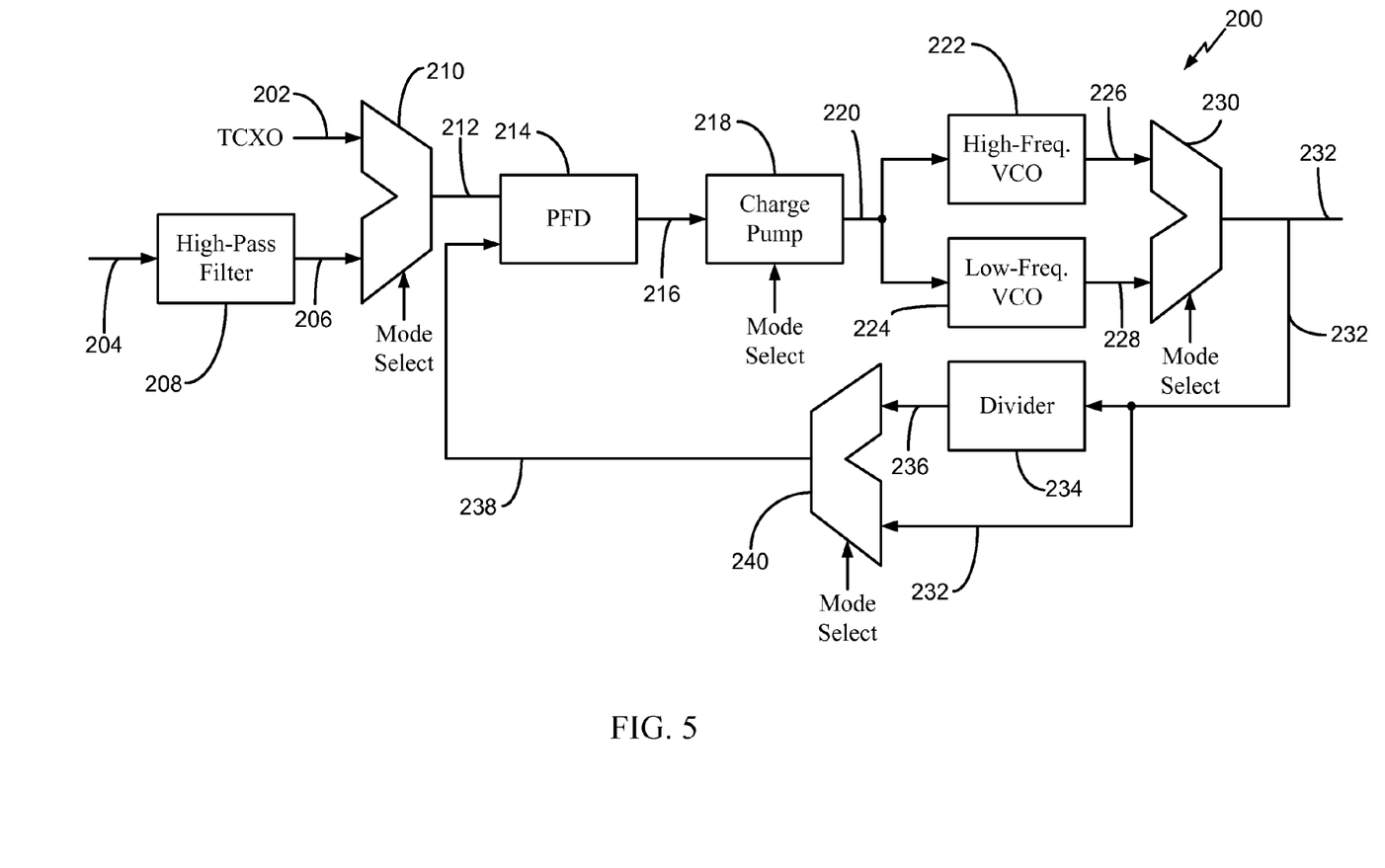
FIG. 5 is a block diagram of a transceiver, according to an exemplary embodiment of the present invention.

FIG. 5 is a block diagram of a portion of an NFC transceiver 200, according to an exemplary embodiment of the present invention. Transceiver 200 includes a high-pass filter 208, which is configured to receive an input signal 204. Transceiver 200 further includes a multiplexer 210, which is configured to receive a filtered signal 206 output from high-pass filter 208 at one input and a temperature compensated crystal oscillator (TCXO) signal 202 at another input. Depending on a selected mode of operation, multiplexer 210 is configured to select and pass either TCXO signal 202 or signal 206 as reference signal 212. Moreover, transceiver 200 includes a phase-frequency detector 214, which is coupled to and configured to receive reference signal 212 output from multiplexer 210. Phase-frequency detector 214 is also configured to receive a feedback signal 238.

An output of phase-frequency detector 214 is coupled to a charge pump 218, which conveys an output signal 220 to each of a high-frequency voltage-controlled oscillator (VCO) 222 and a low-frequency voltage-controlled oscillator (VCO) 224. More specifically, phase-frequency detector 214 compares the phase and frequency of feedback signal 238 to reference signal 212. A difference signal 216 is generated by phase-frequency detector 214 to indicate mismatches between the reference signal 212 and feedback signal 238. In most cases, difference signal 216 includes an "up" signal, which indicates that an output signal 232 needs to increase in frequency or a "down" signal indicating that the output signal 232 needs to decrease in frequency. These up and down signals drive charge pump 218, which generates signal 220 indicative of how much correction is required in output signal 232. It is noted that a charge pump current may be reduced, via "mode select," while in a tag mode.

Figure 9:
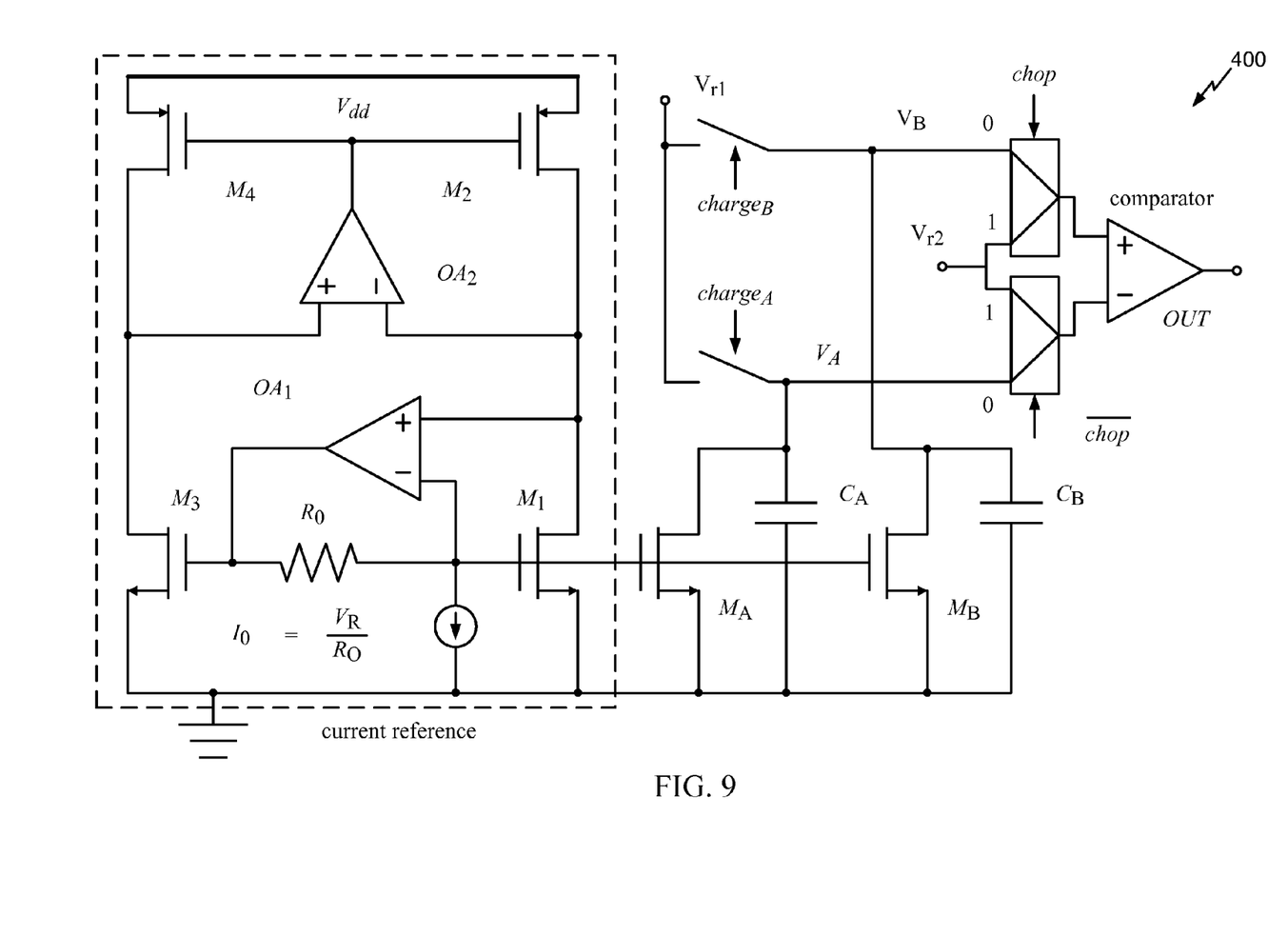
FIG. 9 illustrates an example of a low-power oscillator.

By way of example only, high-frequency VCO 222 may be configured to operate at an integer multiple of 13.56 MHz. As a more specific example, high-frequency VCO 222 may be configured to operate at 542 MHZ (i.e., 40*13.56 MHz). Moreover, as an example, low-frequency VCO 224 may be configured to operate at 13.56 MHz. As an example, low-frequency VCO 224 may comprise a low power oscillator 400, as illustrated in FIG. 9. A person having ordinary skill in the art will understand the configuration and operation of low power oscillator 400 and, therefore, low power oscillator 400 will not be further described. It is noted that although transceiver 200 includes two VCOs, a single VCO may be used. It is further noted that a high-frequency VCO (e.g., high-frequency VCO 222) typically consumes more power in comparison to a low-frequency VCO (e.g., low-frequency VCO 224) and, therefore, it may be desirable to used two VCOs, as illustrated in FIG. 5.

With reference again to FIG. 5, transceiver 200 further includes a multiplexer 230, which is configured to receive a signal 226 output from high-frequency VCO 222 and a signal 228 output from low-frequency VCO 224. Depending on a mode of operation, multiplexer 230 is configured to select and pass either signal 226 or signal 228. Additionally, an output of multiplexer 230 (i.e., signal 232) is coupled to each of a feedback divider 234 and a first port of a multiplexer 240. An output of feedback divider 234 is configured to convey a signal 236 to another port of multiplexer 240. It is noted that divider 234 may be configured to reduce the frequency of signal 232 by, for example only, a factor of forty. Depending on a selected mode of operation, multiplexer 240 is configured to pass either signal 236, which is output from divider 234, or signal 232, which is output from multiplexer 230. Further, multiplexer 240 is configured to convey feedback signal 238 to phase-frequency detector 214. As will be appreciated by a person having ordinary skill, feedback signal 238 adjusts and eventually locks to the same frequency and close to the same phase as reference signal 212. It is noted that each of multiplexer 210, multiplexer 230, multiplexer 240, and charge pump 218 are configured to receive a mode select signal for configuring associated modes thereof.

Figure 6:
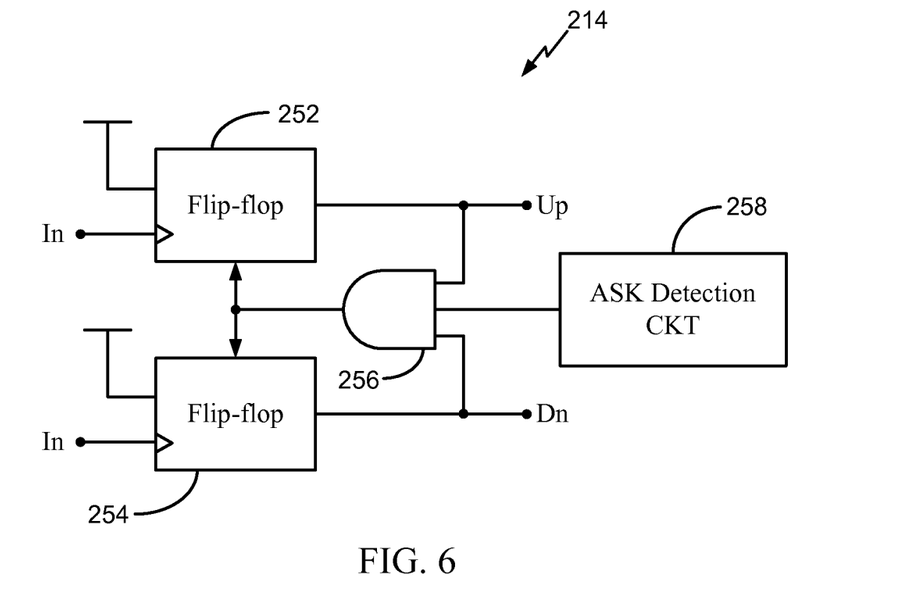
FIG. 6 depicts a phase-frequency detector including an amplitude-shift keying detection circuit, according to an exemplary embodiment of the present invention.

FIG. 6 depicts phase-frequency detector 214, according to an exemplary embodiment of the present invention. Phase-frequency detector 214 includes a first flip-flop 252 having one input coupled to an input In and another input coupled to a reference voltage. Phase-frequency detector 214 also includes a second flip-flop 254 having one input coupled to input In and another input coupled to the reference voltage (i.e., reference signal 212). Further, phase-frequency detector 214 includes an AND gate 256 having a first input coupled to an "Up" output, a second input coupled to a "Dn" output, and a third input coupled to an output of an ASK detection circuit 258. ASK detection circuit 258, which is described more fully below, is configured to detect a 100% ASK mode of operation.

Phase-frequency detector 214 is configured to identify 100% ASK transition and reset "Up" and "Dn" outputs in such intervals. Accordingly, phase-frequency detector 214 may not disturb charge pump 218 (see FIG. 5) in absence of a clock transition on an input signal. Further, ASK detection circuit 258 may not disturb the operation of phase-frequency detector 214 when a 100% ASK mode of operation is not occurring.

Figure 8:
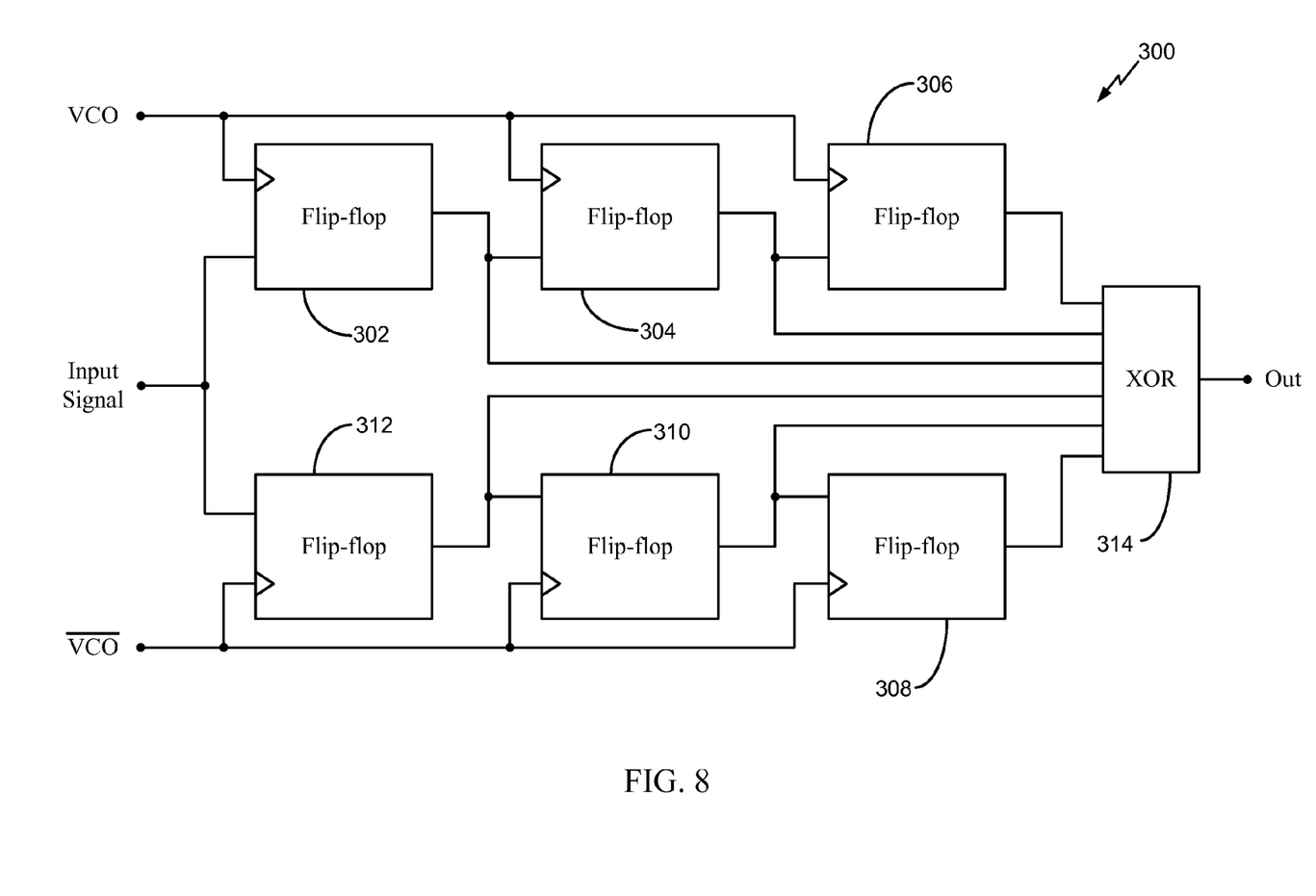
FIG. 8 is a block diagram of an amplitude-shift keying detection circuit, according to an exemplary embodiment of the present invention.

FIG. 8 is a block diagram of amplitude-shift keying (ASK) detection circuit 258, in accordance with an exemplary embodiment of the present invention. ASK detection circuit 258 includes a plurality (i.e., a chain) of flip-flops (i.e., 302, 304, 306, 308, 310, and 312) and a XOR gate 314, wherein XOR gate 314 is coupled to an output of each flip flop 302, 304, 306, 308, 310, and 312. Further, XOR gate 314 is configured to convey an output signal Out. It is noted that a number of cascade flip-flops may vary depending on requirements of the system.

As illustrated in FIG. 8, each of flip-flops 302, 304, and 306 are configured to sample the input signal at a rising edge of the VCO signal and each of flip-flops 312, 310, and 308 are configured to sample the input signal at a falling edge of the VCO signal. More specifically, three samples of the input signal are taken at the rising edge (i.e., by flip-flops 302, 304, and 306) and three samples of the input signal are taken at the falling edge of the VCO signal (i.e., by flip-flops 312, 310, and 308). Upon sensing a consecutive number of identical bits on the input signal (e.g., a consecutive number of zeros), ASK detection circuit 258 determines that a 100% ASK mode is occurring and an output signal is conveyed (i.e., to AND 256; see FIG. 6). It is noted that although ASK detection circuit 258 includes six flip-flop circuits, wherein three flip-flops are utilized for sampling the input signal at a rising edge of the VCO signal and three flip-flops are utilized for sampling the input signal at a falling edge of the VCO signal, embodiments of the present invention are not so limited. Rather, exemplary embodiments of the present invention include an ASK detection circuit including any number of flip-flop circuits.

Figure 7:
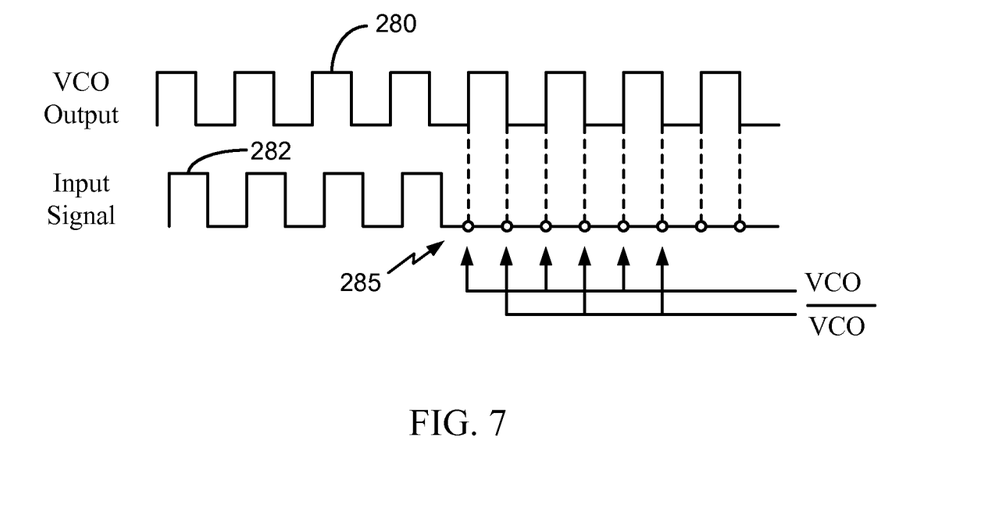
FIG. 7 illustrates waveforms of a phase-frequency detector.

FIG. 7 illustrates example waveforms associated with phase-frequency detector 214 receiving a 100% ASK signal. With specific reference to FIG. 7, signal 280 depicts an output of an associated VCO, and signal 282 represents a received input signal. As illustrated by reference numeral 285, the input signal 282 transitions to a zero, and remains at zero, for at least six samples, wherein the samples are taken at the rising and falling edges of the VCO signal. Accordingly, in this example, ASK detection circuit 258 (see FIG. 6) would determines that a 100% ASK mode is occurring and, in response thereto, convey an output signal to AND 256 (see FIG. 6).

With reference again to FIGS. 5 and 6, a contemplated operation of transceiver 200 will now be described. In a first mode of operation (i.e., initiator mode), multiplexer 210 may be configured to pass (i.e., select) signal 202 from TCXO. Moreover, in this mode, multiplexer 230 may be configured to pass signal 226 from high-frequency VCO 222 and, furthermore, multiplexer 240 may be configured to pass signal 236 from divider 234. Accordingly, in this mode, transceiver 200 may be configured to operate as a high-frequency PLL, which may enable for oversampling of an output signal.

In another mode of operation (i.e., tag mode), multiplexer 210 may be configured to pass signal 206 from high-pass filter 208. Moreover, in this mode, multiplexer 230 may be configured to pass signal 228 from low-frequency VCO 224 and, furthermore, multiplexer 240 may be configured to pass signal 232 from multiplexer 230. Accordingly, in this mode, transceiver 200 may be configured to operate as a low-power PLL, which may enable for a clock to be recovered (i.e., extracted) from a received input signal.

Moreover, during the tag mode, ASK detection circuit 258 may be configured to detect if a 100% ASK mode has occurred and, in the event thereof, may convey a signal to AND gate 256 for resetting phase-frequency detector 214.

Figure 10:
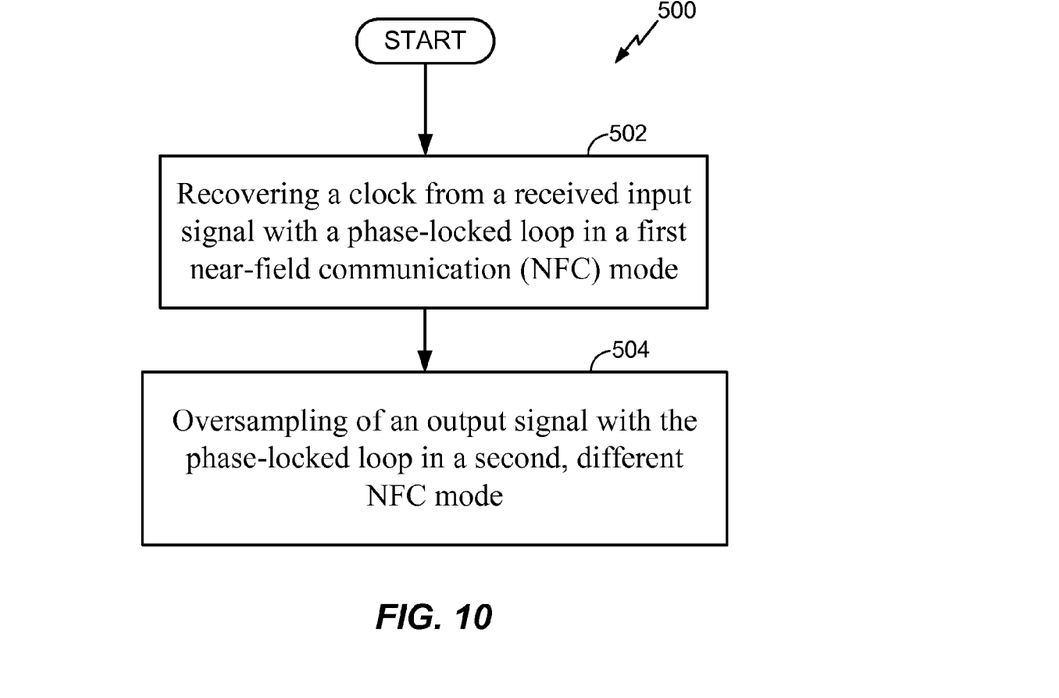
FIG. 10 is a flowchart illustrating a method, according to an exemplary embodiment of the present invention.

FIG. 10 is a flowchart illustrating a method 500, in accordance with one or more exemplary embodiments. Method 500 may include recovering a clock from a received input signal with a phase-locked loop in a first near-field communication (NFC) mode (depicted by numeral 502). Method 500 may also include oversampling of an output signal with the phase-locked loop in a second, different NFC mode (depicted by numeral 504).

Figure 11:
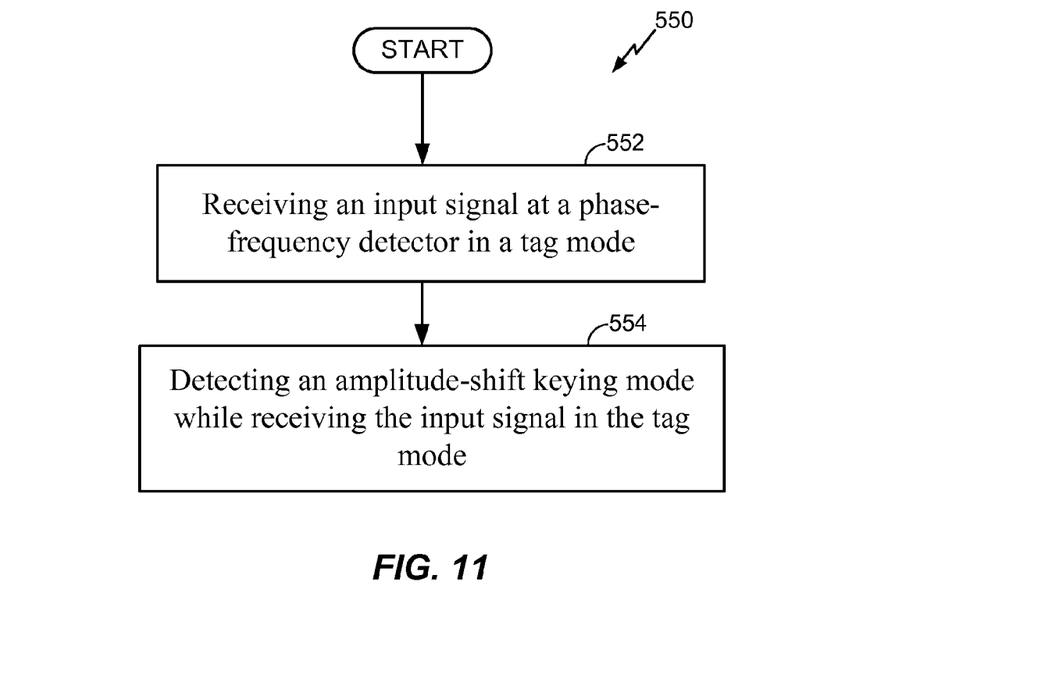
FIG. 11 is a flowchart illustrating another method, according to an exemplary embodiment of the present invention.

FIG. 11 is a flowchart illustrating another method 550, in accordance with one or more exemplary embodiments. Method 550 may include receiving an input signal at a phase-frequency detector in a tag mode (depicted by numeral 552). Further, method 550 may include detecting an amplitude-shift keying mode while receiving the input signal in the tag mode (depicted by numeral 554).

As will be appreciated by a person having ordinary skill in the art in view of the description herein, embodiments of the present may provide for a transceiver including a single PLL core, which can be dynamically configured to operate in an initiator mode or a tag mode. Further, the PLL includes a phase-frequency detector that operates on multiple types of input signals. The PLL enables for two VCO cores, one for high frequency mode of operation (e.g., 542 MHz) and one for low power mode of operation (13.56 MHz). The PLL also includes a programmable divider and charge pump, each of which are reconfigurable for both the high frequency mode of operation and the low power mode of operation.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A circuit comprising a phase-locked loop configured to recover a clock from a received input signal in a first mode and the phase-locked loop further configured for oversampling of an output signal in a second, different mode, the phase-locked loop further configured to detect an amplitude-shift keying mode wherein the input signal undergoes 100% amplitude-shift keying of lacking a transition of the input signal over a plurality of samples.

2. The circuit of claim 1, the phase-locked loop comprising a first voltage controlled oscillator for use in the first mode and a second voltage controlled oscillator for use in the second mode.

3. The circuit of claim 1, the phase-locked loop comprising a phase-frequency detector including an amplitude-shift keying detection circuit configured to detect the amplitude-shift keying mode.

4. The circuit of claim 3, the amplitude-shift keying detection circuit comprising a plurality of flip-flop circuits.

5. The circuit of claim 1, the phase-locked loop comprising a plurality of multiplexers for selecting one of a first path and a second path.

6. The circuit of claim 5, the first path configured for a first frequency and a first power level and the second path configured for a second frequency greater than the first frequency and a second power level greater than the first power level.

7. The circuit of claim 1, the phase-locked loop comprising:

a first circuit path including a first voltage controlled oscillator, the first circuit path for oversampling of the output signal; and a second circuit path including a first voltage controlled oscillator having a frequency lower than a frequency of the first voltage controlled oscillator, the second circuit path for recovering the clock from the received input signal.

8. A circuit, comprising:

a frequency-phase detector; and an amplitude-shift keying detection circuit coupled to the frequency-phase detector and configured to detect an amplitude-shift keying mode wherein a signal undergoes 100% amplitude-shift keying of lacking a transition of the signal over a plurality of samples.

9. The circuit of claim 8, the amplitude-shift keying detection circuit comprising a plurality of flip-flop circuits configured to detect 100% amplitude-shift keying.

10. The circuit of claim 9, each flip-flop circuit of the plurality of flip-flops configured to sample an input signal at an edge of an associated voltage controlled oscillator signal.

11. The circuit of claim 9, the amplitude-shift keying detection circuit further comprising a XOR gate coupled to an output of each flip-flop of the plurality of flip-flops.

12. The circuit of claim 8, the amplitude-shift keying detection circuit configured to convey a signal to the frequency-phase detector to reset the frequency-phsae detector upon detection of the amplitude-shift keying mode.

13. The circuit of claim 8, an output of the amplitude-shift keying detection circuit coupled to an NAND gate of the frequency-phase detector.

14. A method, comprising:

recovering a clock from a received input signal with a phase-locked loop in a first near-field communication (NFC) mode;

detecting an amplitude-shift keying mode wherein the input signal undergoes 100% amplitude-shift keying of lacking a transition of the input signal over a plurality of samples; and oversampling of an output signal with the phase-locked loop in a second, different NFC mode, the recovering comprising utilizing a first circuit path of the phase-locked loop and the oversampling comprising utilizing a second, different circuit path of the phase-locked loop.

15. The method of claim 14, the recovering comprising recovering the clock from the received input signal in a tag mode.

16. The method of claim 14, the oversampling comprising oversampling the output signal in an initiator mode.

17. A method, comprising:

receiving an input signal at a phase-frequency detector in a tag mode; and detecting an amplitude-shift keying mode wherein the input signal undergoes 100% amplitude-shift keying of lacking a transition of the input signal over a plurality of samples while receiving the input signal in the tag mode.

18. The method of claim 17, further comprising resetting the phase-frequency detector upon detecting the amplitude-shift keying mode.

19. The method of claim 17, the detecting comprising detecting a consecutive number of zeros in the input signal.

20. The method of claim 17, the detecting comprising sampling the input signal with a plurality of flip-flop circuits.

21. The method of claim 17, the sampling comprising sampling the input signal at each of a rising edge and a falling edge of an output of an associated voltage controlled oscillator.

22. A device, comprising:

means for recovering a clock from a received input signal in a first NFC mode, the means for recovering utilizing a first circuit path of a phase-locked loop means;

means for detecting an amplitude-shift keying mode wherein the input signal undergoes 100% amplitude-shift keying of lacking a transition of the input signal over a plurality of samples; and means for oversampling of an output signal in a second, different near-field communication (NFC) mode, the means for oversampling utilizing a second, different circuit path in a phase-locked loop means.

23. A device, comprising:

means for receiving an input signal in a tag mode; and means for detecting an amplitude-shift keying mode wherein the input signal undergoes 100% amplitude-shift keying of lacking a transition of the input signal over a plurality of samples while receiving the input signal in the tag mode.

* * * * *